United States Patent [19]

Chandler et al.

[11] Patent Number: 5,279,926
[45] Date of Patent: Jan. 18, 1994

[54] METHOD AND APPARATUS FOR REMOVING VAPOR FROM A PRESSURIZED SPRAYED LIQUID IN THE MANUFACTURE OF SEMICONDUCTOR INTEGRATED CIRCUITS

[75] Inventors: Willard F. Chandler, Byron; Robert D. Johnson; Steven E. Monahan, both of Rochester; Ronald W. Olson, Dodge Center, all of Minn.

[73] Assignee: International Business Machines Corporation, Armonk, N.Y.

[21] Appl. No.: 879,665

[22] Filed: May 6, 1992

[51] Int. Cl.$^5$ .................................. G03C 5/00
[52] U.S. Cl. .................................. 430/311; 430/331; 430/327; 134/33; 134/104.2; 134/104.1; 134/902; 427/273; 427/240
[58] Field of Search ........... 430/311, 331, 327; 134/902, 33, 104.2, 104.1; 427/273, 240

[56] References Cited

U.S. PATENT DOCUMENTS

| | | | |
|---|---|---|---|
| 2,811,219 | 10/1957 | Wenzl | 55/170 |
| 3,826,064 | 7/1974 | Nye et al. | 55/204 |
| 4,113,492 | 9/1978 | Sato et al. | 430/271 |
| 4,510,176 | 4/1985 | Cuthbert et al. | 430/311 |
| 4,518,678 | 5/1985 | Allen | 430/311 |
| 4,662,908 | 5/1987 | Suzuki et al. | 55/204 |
| 4,685,975 | 8/1987 | Kottmann et al. | 134/33 |
| 4,886,728 | 12/1989 | Salamy et al. | 430/311 |
| 5,001,084 | 3/1991 | Kawai et al. | 134/33 |

FOREIGN PATENT DOCUMENTS 0006843  1/1988  Japan ................................. 134/34

Primary Examiner—Morton Foelak
Assistant Examiner—Rachel Johnson
Attorney, Agent, or Firm—J. Michael Anglin

[57] ABSTRACT

Pressurized liquid solvent is dispensed on specific areas of a semiconductor wafer. A vented accumulator removes bubbles introduced by an upstream needle valve. The accumulator outlet leads directly to a dispensing tip, without further pressure drop.

10 Claims, 1 Drawing Sheet

METHOD AND APPARATUS FOR REMOVING VAPOR FROM A PRESSURIZED SPRAYED LIQUID IN THE MANUFACTURE OF SEMICONDUCTOR INTEGRATED CIRCUITS

BACKGROUND OF THE INVENTION

The present invention is directed to the application of pressurized liquid to a semiconductor wafer or similar workpiece, and more particularly concerns the removal therefrom of vapor introduced during regulation of the liquid flow.

During the manufacture of integrated circuits on a semiconductor wafer, a photoresist applied to the top surface of the wafer. The wafer is placed in a chuck of a stepper tool for exposing the photoresist in a pattern which defines the devices and interconnection of the circuits to be formed on the wafer. To avoid contamination of the chuck, the photoresist must be kept off the back side of the wafer, and preferably also away from a thin bead around the periphery of the front side.

Conventionally, a very small amount of solvent liquid is dispensed at low pressure for a short time onto carefully determined areas of the wafer while the photoresist coating is being applied, so as to dissolve any photoresist in those areas. However, regulating the flow of this pressurized solvent introduces vapor bubbles into the liquid. A conventional needle valve, for example, regulates the flow very well, but it also generates a stream of tiny bubbles in the highly volatile solvent. These bubbles cause the dispensed solvent to splash into undesired wafer areas, producing pinholes in the photoresist, which ultimately result in defects in the integrated circuits on the wafer. Turning the flow on and off during the process also tends to introduce bubbles, and renders conventional bubble-extraction methods ineffective.

Liquids used for such solvents are highly volatile and flammable, thus compounding the problems in handling them.

SUMMARY OF THE INVENTION

The present invention reduces defects in integrated-circuit wafers by dispensing precise areas of the wafer with a low-pressure regulated flow of bubble-free solvent liquid for a short period of time during the normal processing. Bubbles are removed from the solvent by pressurizing the liquid, regulating the flow of the liquid and thereafter removing the bubbles in a vented accumulator, and dispensing the bubble-free liquid onto a portion of a wafer or workpiece without further pressure changes in the liquid.

An apparatus for carrying out the method includes a vented accumulator placed downstream from an adjustable flow-restriction valve, and a dispensing tip coupled directly to the accumulator, so that vapor bubbles introduced during the flow regulation are removed and are not thereafter reintroduced into the system by further pressure drops.

BRIEF DESCRIPTION OF THE DRAWING

The single FIGURE of the drawing shows a partially schematic view of an apparatus for carrying out the present invention.

DESCRIPTION OF A PREFERRED EMBODIMENT

Figure 1:
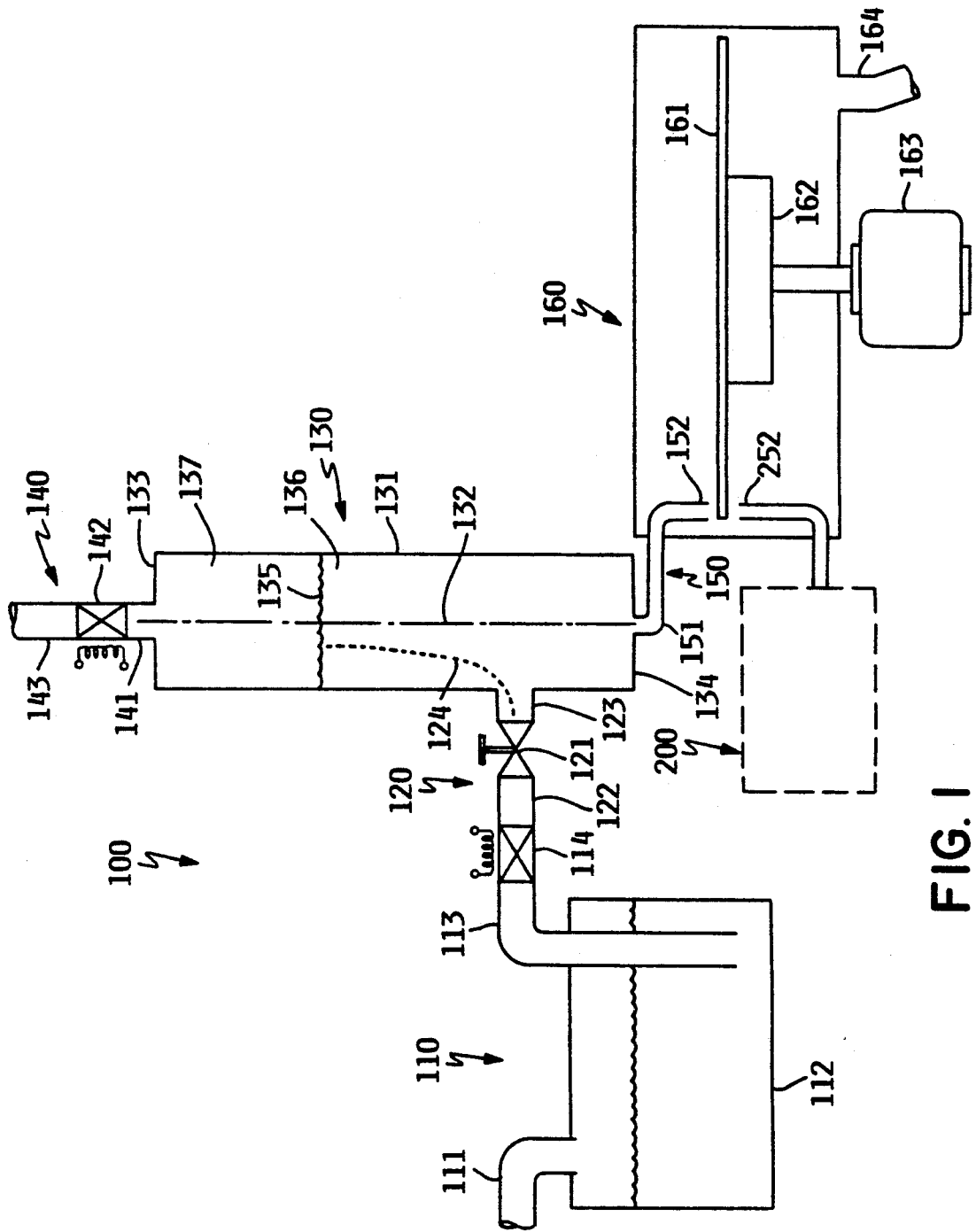

The drawing shows a system 100 for dispensing a highly flammable photoresist solvent, such as acetone, N-butyl acetate, or N-methyl-2-pyrrolidone (NMP) onto predetermined areas of a rotating semiconductor wafer.

Supply means 110 introduces liquid solvent into the apparatus. Sealed storage canister 112 is kept partially full of solvent; in this application, one or two liters of solvent lasts for an entire week's manufacture. Pressure line 111 introduces nitrogen to maintain a low pressure, typically 1-3 psi, on the solvent. Inlet pipe 113 placed below the top of the liquid in tank 112. Conventional on/off solenoid valve 114 is remotely operated by a process computer (not shown) to start and stop the supply of liquid. This valve opens for a very short portion of the time required to process a wafer, typically only for about 7 sec. during a process lasting 60-90 sec.

Flow regulator 120 uses a needle valve 121 or similar adjustable valve of conventional design for partially restricting the flow of liquid to a desired rate, typically about 4 ml over the 7 sec. dispense duration. Inlet pipe 122 couples supply means 110 to valve 121 of the flow regulator. Pipe 123 or a simple coupling connects the outlet of valve 121 to accumulator 130. Flow regulators in general, and needle valves in particular, produce streams of vapor bubbles in the highly volatile solvent liquids for which this preferred embodiment is designed. Vapor bubbles form when the differential pressure across the flow regulator allows some of the liquid to evaporate. Dots 124 indicate the formation and flow of these bubbles.

Accumulator 130 preferably has a cylindrical side wall 131 with a vertical axis 132, closed by upper wall 133 and lower wall 134. Pipe or coupling 123 enters the side wall at a level above the bottom wall, but below the level 135 of liquid 136 in the accumulator. A typical an accumulator for this application is about 6 in. high and about 0.75 in. in diameter. Bubbles 124 rise through the liquid in the accumulator body to a vapor space 137 above level 135, where the vapor accumulates. (The conventional tangential introduction of liquid into an accumulator to provide additional vapor extraction from differential centrifugal forces is not effective in this application. The solvent flow is intermittent, turned on and off repeatedly during processing of wafers; there is not enough time or pressure to set up any appreciable swirling flow in the accumulator. Also, such flow may have adverse effects such as foaming in the low-viscosity solvent liquid.)

Vent means 140 has a vent pipe 141 which pierces the upper wall and is connected to a normally closed solenoid valve 142. This valve is opened manually or automatically at intervals to maintain the correct liquid volume in the accumulator. Vent outlet pipe 143 routes the vapor to an exhausted container (not shown) when the valve opens.

Outlet means 150 has a small (typically 0.03-0.06 in. inside diameter) outlet pipe 151 leading from lower wall 134 of the accumulator to a dispensing tip 152. This tip may be merely a squared-off end in pipe 151, or it may be a short section of a different material. Pipe 151 leads directly from the accumulator to the tip; it is physically short, and neither it nor the dispensing tip introduces any appreciable restrictions or impediments into the flow of the liquid. The significant point is that no pressure drop occurs between accumulator 130 and tip 152—that is, between the place where the bubbles are removed and the place where the liquid is released into the atmosphere. Because no pressure drop occurs, no vapor can form. (Once the liquid is released from the tip into the atmosphere, some evaporation will occur before the liquid strikes its intended target; however, this vapor is carried away into the atmosphere, and does not produce splashes in the liquid stream. The only bubbles which cause splashes are those already in the liquid when it is ejected from the tip; only those can momentarily change the flow from the tip.) The flow from tip 152 is low, typically just over drip speed, enough to keep it aimed at the proper area of the wafer.

Preferably, all piping and valves are made of a relatively inert material such as polytetrafluoroethylene (Teflon (®)). Bends in the piping need have a radius only large enough to prevent crimps or other flow restrictions in the liquid.

Work enclosure 160 holds a semiconductor wafer workpiece 161, here shown edge-on, in a conventional holder or chuck 162. Conventional driving means 163 rotates the wafer. Photoresist application and other processing steps, not shown, are performed on the wafer in a conventional manner. Tip 152 is here aimed at the front side of the wafer, to remove a 1 mm bead of previously applied photoresist from the upper side of the wafer around its periphery. Such a bead reduces chipping and cracking of the photoresist at later stages of the processing. The preferred embodiment also includes another liquid-dispensing system 200. This system may be the same as system 100; it provides another spray from tip 253 to the back side of wafer 161, to prevent photoresist from being transferred to other processing equipment along with the wafer. Drain 164 carries away the used solvent, photoresist, and other effluvia from enclosure 160.

What is claimed is:

1. A method for dispensing a pressurized liquid onto a workpiece, comprising the following steps, in the order specified:

pressurizing said liquid;

regulating the flow of said liquid by restricting its flow;

introducing said liquid into a vapor accumulator having an upper and a lower end, at a point above said lower end;

conveying said liquid directly from said lower end of said accumulator to a dispensing tip without pressure drop;

dispensing said liquid onto said workpiece from said tip; and during the above steps, venting gas from said accumulator.

2. The method of claim 1, wherein said workpiece is a semiconductor wafer.

3. The method of claim 2, comprising the further step of rotating said wafer while dispensing said liquid onto only a predetermined portion of said wafer.

4. The method of claim 2, wherein said liquid is a photoresist solvent.

5. Apparatus for dispensing a pressurized liquid onto a workpiece, comprising:

inlet means for introducing a pressurized supply of said liquid;

adjustable valve means coupled to said inlet means for adjustably restricting the flow of said liquid, said valve means unavoidably introducing vapor into said liquid;

accumulator means for removing said from said liquid, said accumulator being coupled to receive said liquid from said valve means;

vent means coupled to said upper wall of said accumulator for releasing said vapor from said accumulator;

tip means for dispensing said liquid onto said workpiece;

outlet means for coupling said accumulator directly to said tip means, without introducing any restrictions into the flow of said liquid.

6. The apparatus of claim 5, wherein said adjustable valve means comprises a needle valve.

7. The apparatus of claim 5, wherein said vent means includes a venting valve for controllably releasing said vapor.

8. The apparatus of claim 5, wherein said accumulator means is a cylinder having a vertical axis.

9. The apparatus of claim 8, wherein said accumulator has a lower wall coupled to said outlet means.

10. The apparatus of claim 8, wherein said accumulator has a side wall coupled to said adjustable valve means for receiving said liquid.

* * * * *